(12) United States Patent
Mizoguchi

(10) Patent No.: US 9,215,046 B2
(45) Date of Patent: Dec. 15, 2015

(54) FAULT DIAGNOSIS DEVICE FOR MULTIPLEXER

(71) Applicant: DENSO CORPORATION, Kariya-city, Aichi-pref. (JP)

(72) Inventor: Tomomichi Mizoguchi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 186 days.

(21) Appl. No.: 13/914,883

(22) Filed: Jun. 11, 2013

(65) Prior Publication Data

US 2014/0022913 A1 Jan. 23, 2014

(30) Foreign Application Priority Data

Jul. 17, 2012 (JP) .................................. 2012-158286

(51) Int. Cl.
*H04L 1/24* (2006.01)
*G01R 31/14* (2006.01)
*G01R 31/319* (2006.01)
*G01R 31/327* (2006.01)
*G01R 31/04* (2006.01)

(52) U.S. Cl.
CPC ................ *H04L 1/24* (2013.01); *G01R 31/041* (2013.01); *G01R 31/14* (2013.01); *G01R 31/31926* (2013.01); *G01R 31/327* (2013.01)

(58) Field of Classification Search
CPC .................. H04J 3/00; G05B 19/0425; G05B 2219/21137; G05B 2219/24069; G05B 2219/25435; G01R 31/041
See application file for complete search history.

(56) References Cited

U.S. PATENT DOCUMENTS

| 4,868,413 A * | 9/1989 | Oakland et al. ............... 327/408 |
| 5,543,731 A * | 8/1996 | Sigal et al. ...................... 326/40 |
| 8,386,862 B2 * | 2/2013 | Terae et al. .................... 714/724 |
| 2007/0252744 A1 | 11/2007 | Takeuchi |
| 2010/0235699 A1 | 9/2010 | Terae et al. |

FOREIGN PATENT DOCUMENTS

| JP | 1-319818 | 12/1989 |
| JP | H02-013867 | 1/1990 |

(Continued)

OTHER PUBLICATIONS

Office Action (1 page) dated Apr. 30, 2014, issued in corresponding Japanese Application No. 2012-158286 and English translation (1 page).

*Primary Examiner* — Habte Mered
(74) *Attorney, Agent, or Firm* — Nixon & Vanderhye P.C.

(57) ABSTRACT

The fault diagnosis device is for a multiplexer having inner channels selectable by a selection signal. At least two of the inner channels are assigned with input channels. Two of the inner channels in a mutually exclusive relationship are assigned with first and second diagnostic channels. Input voltages of the first and second diagnostic channels are applied with first and second diagnostic voltages, respectively. The fault diagnostic device includes a voltage detection section configured to detect a first detection voltage appearing at the output channel when the first diagnostic channel is selected and a second detection voltage appearing at the output channel when the second diagnostic channel is selected, and a diagnosis section configured to determine that the multiplexer is faulty upon detecting that the first detection voltage is different from the first diagnostic voltage or the second detection voltage is different from the second diagnostic voltage.

9 Claims, 17 Drawing Sheets

(56) References Cited

FOREIGN PATENT DOCUMENTS

| JP | 8-56160 | 2/1996 |
| JP | 8-330959 | 12/1996 |
| JP | 2007-300469 | 11/2007 |
| JP | 4801180 | 8/2011 |

* cited by examiner

FIG.2

| INPUT CHANNEL | SELECTION SIGNAL | | | Vcom IN NORMAL STATE | Vcom IN FAULT STATES | | | | | | | | | | | | |
|---|---|---|---|---|---|---|---|---|---|---|---|---|---|---|---|---|---|
| | A | B | C | | STICK FAULT | | | | | | | PIN SHORT-CIRCUIT FAULT | | | | | |
| | | | | | A=L | A=H | B=L | B=H | C=L | C=H | A=B=L | A=B=H | B=C=L | B=C=H | C=A=L | C=A=H |
| CH0 | L | L | L | V0 | V0 | V1 | V0 | V2 | V0 | V4 | V0 | V3 | V0 | V6 | V0 | V5 |
| CH1 | H | L | L | V1 | V0 | V1 | V1 | V3 | V1 | V5 | V0 | V3 | V1 | V7 | V0 | V5 |
| CH2 | L | H | L | V2(VCC) | V2 | V3 | V0 | V2 | V2 | V6 | V0 | V3 | V0 | V6 | V2 | V7 |
| CH3 | H | H | L | V3 | V2 | V3 | V1 | V3 | V3 | V7 | V0 | V3 | V1 | V7 | V2 | V7 |
| CH4 | L | L | H | V4 | V4 | V5 | V4 | V6 | V0 | V4 | V4 | V7 | V0 | V6 | V0 | V5 |
| CH5 | H | L | H | V5(0) | V4 | V5 | V5 | V7 | V1 | V5 | V4 | V7 | V1 | V7 | V0 | V5 |
| CH6 | L | H | H | V6 | V6 | V7 | V4 | V6 | V2 | V6 | V4 | V7 | V0 | V6 | V2 | V7 |
| CH7 | H | H | H | V7 | V6 | V7 | V5 | V7 | V3 | V7 | V4 | V7 | V1 | V7 | V2 | V7 |

FIG.3

| INNER CHANNEL | SELECTION SIGNAL | | | INPUT CHANNEL SELECTION | | | | | | | | REMARKS |
|---|---|---|---|---|---|---|---|---|---|---|---|---|
| | A | B | C | CH0 | CH1 | CH2 | CH3 | CH4 | CH5 | CH6 | CH7 | |
| C0 | L | L | L | ON | OFF | OFF | OFF | OFF | OFF | OFF | OFF | |
| C1 | H | L | L | OFF | ON | OFF | OFF | OFF | OFF | OFF | OFF | |
| C2 | L | H | L | OFF | OFF | ON | OFF | OFF | OFF | OFF | OFF | DIAGNOSTIC CHANNEL |
| C3 | H | H | L | OFF | OFF | OFF | ON | OFF | OFF | OFF | OFF | |
| C4 | L | L | H | OFF | OFF | OFF | OFF | ON | OFF | OFF | OFF | |
| C5 | H | L | H | OFF | OFF | OFF | OFF | OFF | ON | OFF | OFF | DIAGNOSTIC CHANNEL |
| C6 | L | H | H | OFF | OFF | OFF | OFF | OFF | OFF | ON | OFF | |
| C7 | H | H | H | OFF | OFF | OFF | OFF | OFF | OFF | OFF | ON | |

FIG.4

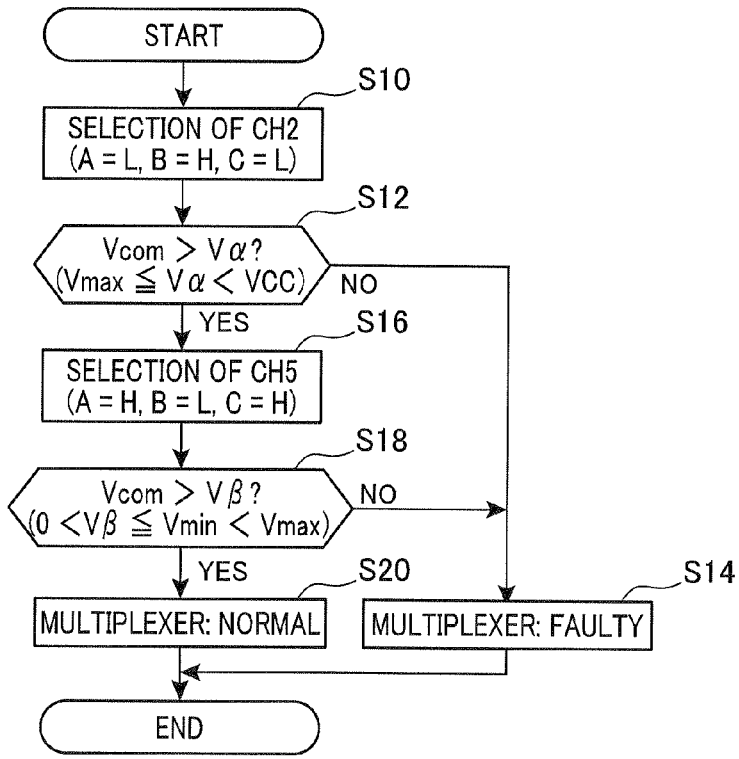

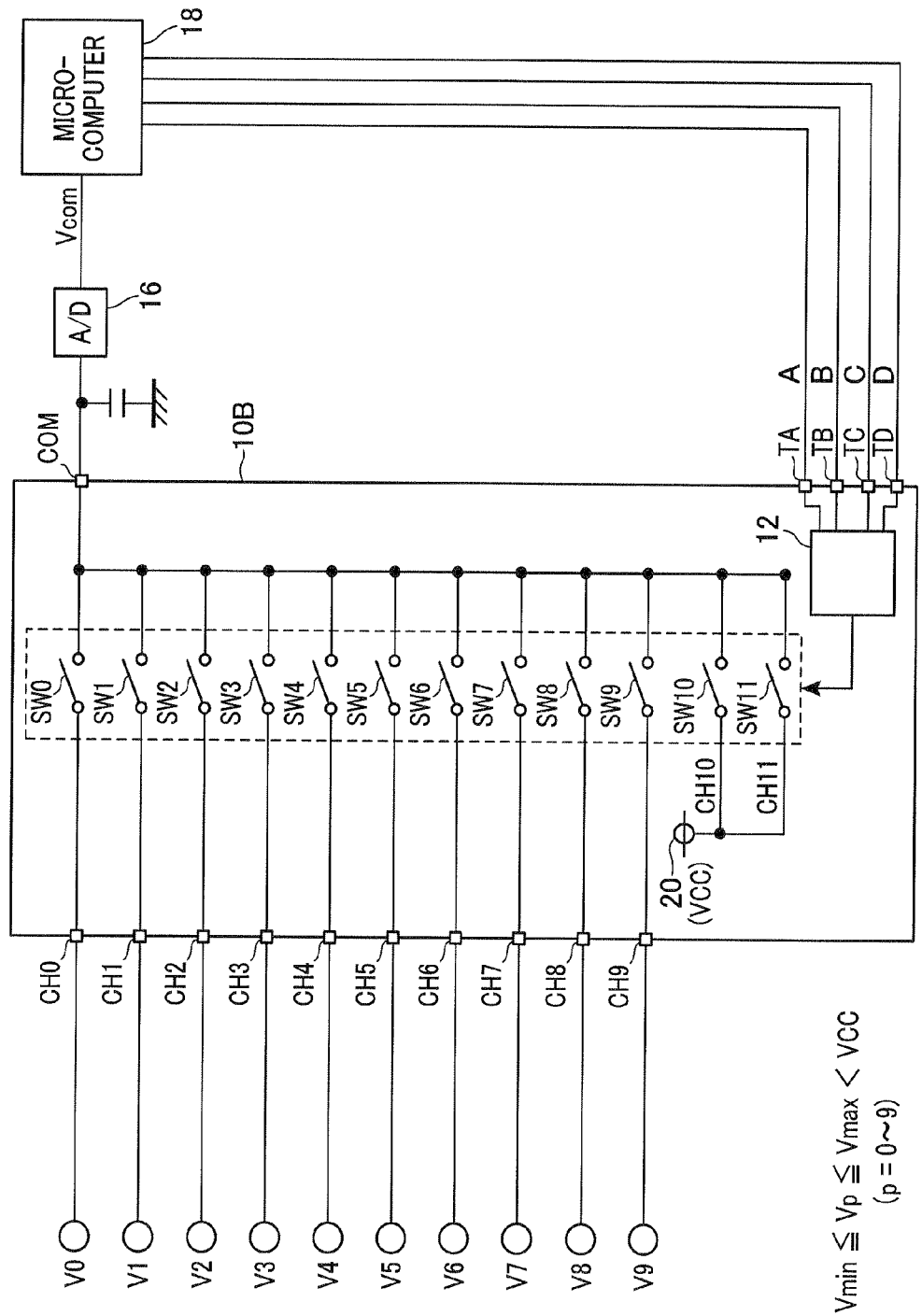

FIG. 8

| CHANNEL SELECTION PATTERNS IN NORMAL STATE | | | | | CHANNEL SELECTION PATTERNS IN FAULT STATES | | | | | | | | | | | | | | | CHANNEL ASSIGNMENT |
|---|---|---|---|---|---|---|---|---|---|---|---|---|---|---|---|---|---|---|---|---|
| INNER CHANNEL | A | B | C | D | STICK FAULT | | | | | | | | PIN SHORT-CIRCUIT FAULT | | | | | | |
| | | | | | A=L | A=H | B=L | B=H | C=L | C=H | D=L | D=H | A=B=L | A=B=H | B=C=L | B=C=H | C=D=L | C=D=H | |
| C0 | L | L | L | L | C0 | C1 | C0 | C2 | C0 | C4 | C0 | C8 | C0 | C3 | C0 | C6 | C0 | C12 | CH0 |
| C1 | H | L | L | L | C0 | C1 | C1 | C3 | C1 | C5 | C1 | C9 | C0 | C3 | C1 | C7 | C1 | C13 | CH1 |
| C2 | L | H | L | L | C2 | C3 | C0 | C2 | C2 | C6 | C2 | C10 | C0 | C3 | C0 | C6 | C2 | C14 | CH2 |
| C3 | H | H | L | L | C2 | C3 | C1 | C3 | C3 | C7 | C3 | C11 | C0 | C3 | C1 | C7 | C3 | C15 | CH3 |
| C4 | L | L | H | L | C4 | C5 | C4 | C6 | C0 | C4 | C4 | C12 | C4 | C7 | C0 | C6 | C0 | C12 | CH4 |
| C5 | H | L | H | L | C4 | C5 | C5 | C7 | C1 | C5 | C5 | C13 | C4 | C7 | C1 | C7 | C1 | C13 | CH10 (DIAGNOSTIC CHANNEL) |
| C6 | L | H | H | L | C6 | C7 | C4 | C6 | C2 | C6 | C6 | C14 | C4 | C7 | C0 | C6 | C2 | C14 | NONUSE CHANNEL |
| C7 | H | H | H | L | C6 | C7 | C5 | C7 | C3 | C7 | C7 | C15 | C4 | C7 | C1 | C7 | C3 | C15 | CH5 |
| C8 | L | L | L | H | C8 | C9 | C8 | C10 | C8 | C12 | C0 | C8 | C8 | C11 | C8 | C14 | C0 | C12 | CH6 |
| C9 | H | L | L | H | C8 | C9 | C9 | C11 | C9 | C13 | C1 | C9 | C8 | C11 | C9 | C15 | C1 | C13 | NONUSE CHANNEL |
| C10 | L | H | L | H | C10 | C11 | C8 | C10 | C10 | C14 | C2 | C10 | C8 | C11 | C8 | C14 | C2 | C14 | CH11 (DIAGNOSTIC CHANNEL) |
| C11 | H | H | L | H | C10 | C11 | C9 | C11 | C11 | C15 | C3 | C11 | C8 | C11 | C9 | C15 | C3 | C15 | CH7 |
| C12 | L | L | H | H | C12 | C13 | C12 | C14 | C8 | C12 | C4 | C12 | C12 | C15 | C8 | C14 | C0 | C12 | NONUSE CHANNEL |
| C13 | H | L | H | H | C12 | C13 | C13 | C15 | C9 | C13 | C5 | C13 | C12 | C15 | C9 | C15 | C1 | C13 | CH8 |
| C14 | L | H | H | H | C14 | C15 | C12 | C14 | C10 | C14 | C6 | C14 | C12 | C15 | C8 | C14 | C2 | C14 | CH9 |
| C15 | H | H | H | H | C14 | C15 | C13 | C15 | C11 | C15 | C7 | C15 | C12 | C15 | C9 | C15 | C3 | C15 | NONUSE CHANNEL |

FIG.10A

| | SELECTION SIGNAL | | | | INPUT CHANNEL SELECTION | | | | | | | | | | | | REMARKS |
|---|---|---|---|---|---|---|---|---|---|---|---|---|---|---|---|---|---|
| | A | B | C | D | CH0 | CH1 | CH2 | CH3 | CH4 | CH5 | CH6 | CH7 | CH8 | CH9 | CH10 (VCC) | CH11 (VCC) | |
| C0 | L | L | L | L | OFF | OFF | OFF | OFF | OFF | OFF | OFF | OFF | OFF | OFF | OFF | OFF | NONUSE CHANNEL CANDIDATE |
| C1 | H | L | L | L | | | | | | | | | | | OFF | OFF | |
| C2 | L | H | L | L | | | | | | | | | | | OFF | OFF | |
| C3 | H | H | L | L | OFF | OFF | OFF | OFF | OFF | OFF | OFF | OFF | OFF | OFF | OFF | OFF | NONUSE CHANNEL CANDIDATE |
| C4 | L | L | H | L | | | | | | | | | | | OFF | OFF | |
| C5 | H | L | H | L | OFF | OFF | OFF | OFF | OFF | OFF | OFF | OFF | OFF | OFF | ON | OFF | DIAGNOSTIC CHANNEL |
| C6 | L | H | H | L | OFF | OFF | OFF | OFF | OFF | OFF | OFF | OFF | OFF | OFF | OFF | OFF | NONUSE CHANNEL CANDIDATE |
| C7 | H | H | H | L | | | | | | | | | | | OFF | OFF | |
| C8 | L | L | L | H | | | | | | | | | | | OFF | OFF | |
| C9 | H | L | L | H | OFF | OFF | OFF | OFF | OFF | OFF | OFF | OFF | OFF | OFF | OFF | OFF | NONUSE CHANNEL CANDIDATE |
| C10 | L | H | L | H | OFF | OFF | OFF | OFF | OFF | OFF | OFF | OFF | OFF | OFF | OFF | ON | DIAGNOSTIC CHANNEL |
| C11 | H | H | L | H | | | | | | | | | | | OFF | OFF | |
| C12 | L | L | H | H | OFF | OFF | OFF | OFF | OFF | OFF | OFF | OFF | OFF | OFF | OFF | OFF | NONUSE CHANNEL CANDIDATE |
| C13 | H | L | H | H | | | | | | | | | | | OFF | OFF | |
| C14 | L | H | H | H | | | | | | | | | | | OFF | OFF | |
| C15 | H | H | H | H | OFF | OFF | OFF | OFF | OFF | OFF | OFF | OFF | OFF | OFF | OFF | OFF | NONUSE CHANNEL CANDIDATE |

FIG.10B

| | SELECTION SIGNAL | | | | INPUT CHANNEL SELECTION | | | | | | | | | | | | REMARKS |
|---|---|---|---|---|---|---|---|---|---|---|---|---|---|---|---|---|---|
| | A | B | C | D | CH0 | CH1 | CH2 | CH3 | CH4 | CH5 | CH6 | CH7 | CH8 | CH9 | CH10 (VCC) | CH11 (VCC) | |
| C0 | L | L | L | L | ON | OFF | OFF | OFF | OFF | OFF | OFF | OFF | OFF | OFF | OFF | OFF | |
| C1 | H | L | L | L | OFF | ON | OFF | OFF | OFF | OFF | OFF | OFF | OFF | OFF | OFF | OFF | |
| C2 | L | H | L | L | OFF | OFF | ON | OFF | OFF | OFF | OFF | OFF | OFF | OFF | OFF | OFF | |
| C3 | H | H | L | L | OFF | OFF | OFF | ON | OFF | OFF | OFF | OFF | OFF | OFF | OFF | OFF | |
| C4 | L | L | H | L | OFF | OFF | OFF | OFF | ON | OFF | OFF | OFF | OFF | OFF | OFF | OFF | |
| C5 | H | L | H | L | OFF | OFF | OFF | OFF | OFF | OFF | OFF | OFF | OFF | OFF | ON | OFF | DIAGNOSTIC CHANNEL |
| C6 | L | H | H | L | OFF | OFF | OFF | OFF | OFF | OFF | OFF | OFF | OFF | OFF | OFF | OFF | NONUSE CHANNEL |
| C7 | H | H | H | L | OFF | OFF | OFF | OFF | OFF | ON | OFF | OFF | OFF | OFF | OFF | OFF | |
| C8 | L | L | L | H | OFF | OFF | OFF | OFF | OFF | OFF | ON | OFF | OFF | OFF | OFF | OFF | |
| C9 | H | L | L | H | OFF | OFF | OFF | OFF | OFF | OFF | OFF | OFF | OFF | OFF | OFF | OFF | NONUSE CHANNEL |
| C10 | L | H | L | H | OFF | OFF | OFF | OFF | OFF | OFF | OFF | OFF | OFF | OFF | OFF | ON | DIAGNOSTIC CHANNEL |
| C11 | H | H | L | H | OFF | OFF | OFF | OFF | OFF | OFF | OFF | ON | OFF | OFF | OFF | OFF | |
| C12 | L | L | H | H | OFF | OFF | OFF | OFF | OFF | OFF | OFF | OFF | OFF | OFF | OFF | OFF | NONUSE CHANNEL |
| C13 | H | L | H | H | OFF | OFF | OFF | OFF | OFF | OFF | OFF | OFF | ON | OFF | OFF | OFF | |
| C14 | L | H | H | H | OFF | OFF | OFF | OFF | OFF | OFF | OFF | OFF | OFF | ON | OFF | OFF | |
| C15 | H | H | H | H | OFF | OFF | OFF | OFF | OFF | OFF | OFF | OFF | OFF | OFF | OFF | OFF | NONUSE CHANNEL |

FIG.13

| | SELECTION SIGNAL | | | | INPUT CHANNEL SELECTION | | | | | | | | | | | | REMARKS |
|---|---|---|---|---|---|---|---|---|---|---|---|---|---|---|---|---|---|
| | A | B | C | D | CH0 | CH1 | CH2 | CH3 | CH4 | CH5 | CH6 | CH7 | CH8 | CH9 | CH10 (VCC) | CH11 (VCC) | |
| C0 | L | L | L | L | ON | OFF | OFF | OFF | OFF | OFF | OFF | OFF | OFF | OFF | OFF | OFF | |
| C1 | H | L | L | L | OFF | ON | OFF | OFF | OFF | OFF | OFF | OFF | OFF | OFF | OFF | OFF | |
| C2 | L | H | L | L | OFF | OFF | OFF | OFF | OFF | OFF | OFF | OFF | OFF | OFF | ON | OFF | DIAGNOSTIC CHANNEL |
| C3 | H | H | L | L | OFF | OFF | ON | OFF | OFF | OFF | OFF | OFF | OFF | OFF | OFF | OFF | |
| C4 | L | L | H | L | OFF | OFF | OFF | OFF | OFF | OFF | OFF | OFF | OFF | OFF | OFF | OFF | NONUSE CHANNEL |
| C5 | H | L | H | L | OFF | OFF | OFF | ON | OFF | OFF | OFF | OFF | OFF | OFF | OFF | OFF | |
| C6 | L | H | H | L | OFF | OFF | OFF | OFF | ON | OFF | OFF | OFF | OFF | OFF | OFF | OFF | |
| C7 | H | H | H | L | OFF | OFF | OFF | OFF | OFF | OFF | OFF | OFF | OFF | OFF | OFF | OFF | NONUSE CHANNEL |
| C8 | L | L | L | H | OFF | OFF | OFF | OFF | OFF | OFF | OFF | OFF | OFF | OFF | OFF | OFF | NONUSE CHANNEL |
| C9 | H | L | L | H | OFF | OFF | OFF | OFF | OFF | ON | OFF | OFF | OFF | OFF | OFF | OFF | |
| C10 | L | H | L | H | OFF | OFF | OFF | OFF | OFF | OFF | ON | OFF | OFF | OFF | OFF | OFF | |
| C11 | H | H | L | H | OFF | OFF | OFF | OFF | OFF | OFF | OFF | OFF | OFF | OFF | OFF | OFF | NONUSE CHANNEL |
| C12 | L | L | H | H | OFF | OFF | OFF | OFF | OFF | OFF | OFF | ON | OFF | OFF | OFF | OFF | |
| C13 | H | L | H | H | OFF | OFF | OFF | OFF | OFF | OFF | OFF | OFF | OFF | OFF | OFF | ON | DIAGNOSTIC CHANNEL |
| C14 | L | H | H | H | OFF | OFF | OFF | OFF | OFF | OFF | OFF | OFF | ON | OFF | OFF | OFF | |
| C15 | H | H | H | H | OFF | OFF | OFF | OFF | OFF | OFF | OFF | OFF | OFF | ON | OFF | OFF | |

FIG.14

| | SELECTION SIGNAL | | | | INPUT CHANNEL SELECTION | | | | | | | | | | | | REMARKS |
|---|---|---|---|---|---|---|---|---|---|---|---|---|---|---|---|---|---|
| | A | B | C | D | CH0 | CH1 | CH2 | CH3 | CH4 | CH5 | CH6 | CH7 | CH8 | CH9 | CH10 | CH11 | |
| C0 | L | L | L | L | ON | OFF | OFF | OFF | OFF | OFF | OFF | OFF | OFF | OFF | OFF | OFF | |
| C1 | H | L | L | L | OFF | ON | OFF | OFF | OFF | OFF | OFF | OFF | OFF | OFF | OFF | OFF | |
| C2 | L | H | L | L | OFF | OFF | ON | OFF | OFF | OFF | OFF | OFF | OFF | OFF | OFF | OFF | |
| C3 | H | H | L | L | OFF | OFF | OFF | OFF | OFF | OFF | OFF | OFF | OFF | OFF | ON | OFF | DIAGNOSTIC CHANNEL |
| C4 | L | L | H | L | OFF | OFF | OFF | ON | OFF | OFF | OFF | OFF | OFF | OFF | OFF | OFF | |
| C5 | H | L | H | L | OFF | OFF | OFF | OFF | OFF | OFF | OFF | OFF | OFF | OFF | OFF | OFF | NONUSE CHANNEL |
| C6 | L | H | H | L | OFF | OFF | OFF | OFF | OFF | OFF | OFF | OFF | OFF | OFF | OFF | OFF | NONUSE CHANNEL |
| C7 | H | H | H | L | OFF | OFF | OFF | OFF | ON | OFF | OFF | OFF | OFF | OFF | OFF | OFF | |
| C8 | L | L | L | H | OFF | OFF | OFF | OFF | OFF | ON | OFF | OFF | OFF | OFF | OFF | OFF | |
| C9 | H | L | L | H | OFF | OFF | OFF | OFF | OFF | OFF | OFF | OFF | OFF | OFF | OFF | OFF | NONUSE CHANNEL |
| C10 | L | H | L | H | OFF | OFF | OFF | OFF | OFF | OFF | OFF | OFF | OFF | OFF | OFF | OFF | NONUSE CHANNEL |
| C11 | H | H | L | H | OFF | OFF | OFF | OFF | OFF | OFF | ON | OFF | OFF | OFF | OFF | OFF | |
| C12 | L | L | H | H | OFF | OFF | OFF | OFF | OFF | OFF | OFF | OFF | OFF | OFF | OFF | ON | DIAGNOSTIC CHANNEL |
| C13 | H | L | H | H | OFF | OFF | OFF | OFF | OFF | OFF | OFF | ON | OFF | OFF | OFF | OFF | |
| C14 | L | H | H | H | OFF | OFF | OFF | OFF | OFF | OFF | OFF | OFF | ON | OFF | OFF | OFF | |
| C15 | H | H | H | H | OFF | OFF | OFF | OFF | OFF | OFF | OFF | OFF | OFF | ON | OFF | OFF | |

FIG.15

| | SELECTION SIGNAL | | | | INPUT CHANNEL SELECTION | | | | | | | | | | | | REMARKS |
|---|---|---|---|---|---|---|---|---|---|---|---|---|---|---|---|---|---|
| | A | B | C | D | CH0 | CH1 | CH2 | CH3 | CH4 | CH5 | CH6 | CH7 | CH8 | CH9 | CH10 | CH11 | |
| C0 | L | L | L | L | ON | OFF | OFF | OFF | OFF | OFF | OFF | OFF | OFF | OFF | OFF | OFF | |
| C1 | H | L | L | L | OFF | OFF | OFF | OFF | OFF | OFF | OFF | OFF | OFF | OFF | OFF | OFF | NONUSE CHANNEL |
| C2 | L | H | L | L | OFF | OFF | OFF | OFF | OFF | OFF | OFF | OFF | OFF | OFF | OFF | OFF | NONUSE CHANNEL |
| C3 | H | H | L | L | OFF | ON | OFF | OFF | OFF | OFF | OFF | OFF | OFF | OFF | OFF | OFF | |
| C4 | L | L | H | L | OFF | OFF | OFF | OFF | OFF | OFF | OFF | OFF | OFF | OFF | ON | OFF | DIAGNOSTIC CHANNEL |
| C5 | H | L | H | L | OFF | OFF | ON | OFF | OFF | OFF | OFF | OFF | OFF | OFF | OFF | OFF | |
| C6 | L | H | H | L | OFF | OFF | OFF | ON | OFF | OFF | OFF | OFF | OFF | OFF | OFF | OFF | |
| C7 | H | H | H | L | OFF | OFF | OFF | OFF | ON | OFF | OFF | OFF | OFF | OFF | OFF | OFF | |
| C8 | L | L | L | H | OFF | OFF | OFF | OFF | OFF | ON | OFF | OFF | OFF | OFF | OFF | OFF | |
| C9 | H | L | L | H | OFF | OFF | OFF | OFF | OFF | OFF | ON | OFF | OFF | OFF | OFF | OFF | |
| C10 | L | H | L | H | OFF | OFF | OFF | OFF | OFF | OFF | OFF | ON | OFF | OFF | OFF | OFF | |
| C11 | H | H | L | H | OFF | OFF | OFF | OFF | OFF | OFF | OFF | OFF | OFF | OFF | OFF | ON | DIAGNOSTIC CHANNEL |
| C12 | L | L | H | H | OFF | OFF | OFF | OFF | OFF | OFF | OFF | OFF | ON | OFF | OFF | OFF | |
| C13 | H | L | H | H | OFF | OFF | OFF | OFF | OFF | OFF | OFF | OFF | OFF | OFF | OFF | OFF | NONUSE CHANNEL |
| C14 | L | H | H | H | OFF | OFF | OFF | OFF | OFF | OFF | OFF | OFF | OFF | OFF | OFF | OFF | NONUSE CHANNEL |
| C15 | H | H | H | H | OFF | OFF | OFF | OFF | OFF | OFF | OFF | OFF | OFF | ON | OFF | OFF | |

FIG.16

| SELECTION SIGNAL | | | | INPUT CHANNEL SELECTION | | | | | | | | | | | | REMARKS |
|---|---|---|---|---|---|---|---|---|---|---|---|---|---|---|---|---|
| | A | B | C | D | CH0 | CH1 | CH2 | CH3 | CH4 | CH5 | CH6 | CH7 | CH8 | CH9 | CH10 | CH11 | |
| C0 | L | L | L | L | ON | OFF | OFF | OFF | OFF | OFF | OFF | OFF | OFF | OFF | OFF | OFF | |
| C1 | H | L | L | L | OFF | ON | OFF | OFF | OFF | OFF | OFF | OFF | OFF | OFF | OFF | OFF | |
| C2 | L | H | L | L | OFF | OFF | ON | OFF | OFF | OFF | OFF | OFF | OFF | OFF | OFF | OFF | |
| C3 | H | H | L | L | OFF | OFF | OFF | OFF | OFF | OFF | OFF | OFF | OFF | OFF | OFF | OFF | NONUSE CHANNEL |
| C4 | L | L | H | L | OFF | OFF | OFF | ON | OFF | OFF | OFF | OFF | OFF | OFF | OFF | OFF | |
| C5 | H | L | H | L | OFF | OFF | OFF | OFF | OFF | OFF | OFF | OFF | OFF | OFF | OFF | OFF | NONUSE CHANNEL |
| C6 | L | H | H | L | OFF | OFF | OFF | OFF | OFF | OFF | OFF | OFF | OFF | OFF | ON | OFF | DIAGNOSTIC CHANNEL |
| C7 | H | H | H | L | OFF | OFF | OFF | OFF | ON | OFF | OFF | OFF | OFF | OFF | OFF | OFF | |
| C8 | L | L | L | H | OFF | OFF | OFF | OFF | OFF | ON | OFF | OFF | OFF | OFF | OFF | OFF | |
| C9 | H | L | L | H | OFF | OFF | OFF | OFF | OFF | OFF | OFF | OFF | OFF | OFF | OFF | ON | DIAGNOSTIC CHANNEL |
| C10 | L | H | L | H | OFF | OFF | OFF | OFF | OFF | OFF | OFF | OFF | OFF | OFF | OFF | OFF | NONUSE CHANNEL |
| C11 | H | H | L | H | OFF | OFF | OFF | OFF | OFF | OFF | ON | OFF | OFF | OFF | OFF | OFF | |
| C12 | L | L | H | H | OFF | OFF | OFF | OFF | OFF | OFF | OFF | OFF | OFF | OFF | OFF | OFF | NONUSE CHANNEL |
| C13 | H | L | H | H | OFF | OFF | OFF | OFF | OFF | OFF | OFF | ON | OFF | OFF | OFF | OFF | |
| C14 | L | H | H | H | OFF | OFF | OFF | OFF | OFF | OFF | OFF | OFF | ON | OFF | OFF | OFF | |
| C15 | H | H | H | H | OFF | OFF | OFF | OFF | OFF | OFF | OFF | OFF | OFF | ON | OFF | OFF | |

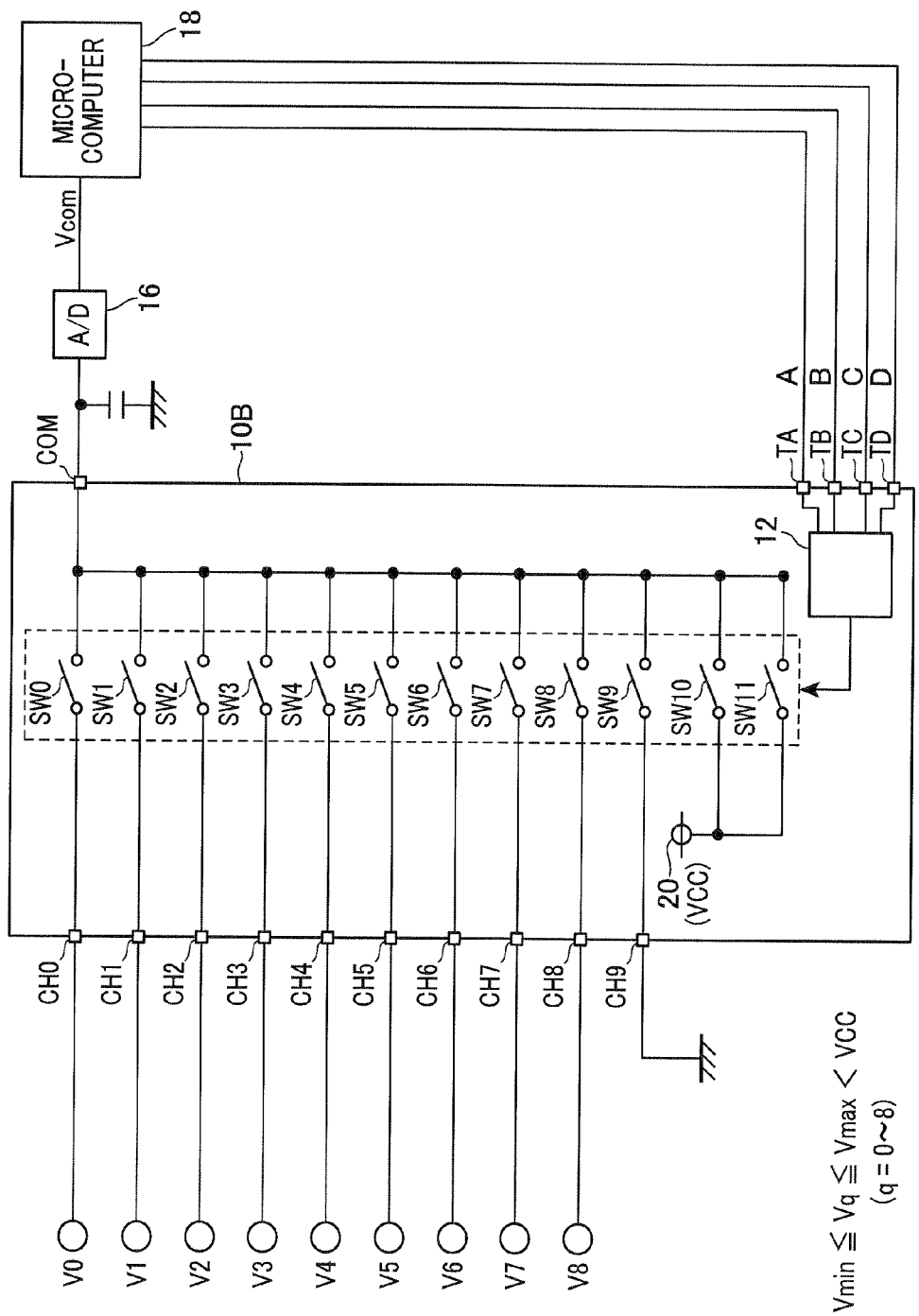

FAULT DIAGNOSIS DEVICE FOR MULTIPLEXER

This application claims priority to Japanese Patent Application No. 2012-158286 filed on Jul. 17, 2012, the entire contents of which are hereby incorporated by reference.

BACKGROUND OF THE INVENTION

1. Field of the Invention

The present invention relates to a fault diagnosis device for a multiplexer.

2. Description of Related Art

Japanese Patent No. 4801180 describes a fault diagnosis device for a multiplexer including a plurality of switches operated to select one of a plurality of input channels to be connected to an output channel. This fault diagnosis device is configured to diagnose whether the multiplexer is faulty or not by monitoring the voltage appearing at the output channel of the multiplexer when different test voltages are successively applied to the plurality of the input channels of the multiplexer.

The fault diagnosis device makes it possible to reliably determine whether the multiplexer is faulty or not. However, the fault diagnosis device has to be provided with a structure for applying the different test voltages to the respective input channels. Accordingly, since the circuit scale of the fault diagnosis device is large, the manufacturing cost thereof is large.

SUMMARY

An exemplary embodiment provides a fault diagnosis device for a multiplexer having a plurality of inner channels selectable by a selection signal represented by a plurality of bits, at least two of the inner channels being respectively assigned with input channels, one of the input channels being selected to be connected to an output channel of the multiplexer in accordance with the selection signal, two of the inner channels which are in a mutually exclusive relationship in logic state being respectively assigned with first and second diagnostic channels, an input voltage of the first diagnostic channel being applied with a first diagnostic voltage, an input voltage of the second diagnostic channel being applied with a second diagnostic voltage, the fault diagnostic device including a voltage detection section configured to detect a first detection voltage appearing at the output channel when the first diagnostic channel is selected by the selection signal and a second detection voltage appearing at the output channel when the second diagnostic channel is selected by the selection signal; and a diagnosis section configured to determine that the multiplexer is faulty upon detecting that the first detection voltage is different from the first diagnostic voltage or the second detection voltage is different from the second diagnostic voltage.

According to the exemplary embodiment, there is provided a fault diagnosis device for a multiplexer, which is small in circuit scale and can reliably diagnose whether the multiplexer is faulty or not.

Other advantages and features of the invention will become apparent from the following description including the drawings and claims.

BRIEF DESCRIPTION OF THE DRAWINGS

In the accompanying drawings:

FIG. 2 is a table showing detection voltages appearing at the output channel of the multiplexer during a fault diagnosis process;

FIG. 3 is a table for explaining a method of assignment of diagnosing channels etc. in the first embodiment;

FIG. 4 is a flowchart showing steps of the fault diagnosis process performed in the first embodiment;

FIG. 7 is a diagram showing a structure of a multiplexer system including a multiplexer and a fault diagnosis device according to a third embodiment of the invention;

FIG. 8 is a diagram showing channel selection patterns in the normal state and fault states in the third embodiment;

FIGS. 10A and 10B are diagrams showing another method of assignment of non-use channels performed in the third embodiment;

FIGS. 12 to 17 are diagram showing methods of assignment of non-use channels performed in other embodiments of the invention; and FIG. 18 is a diagram showing a structure of a multiplexer system including a multiplexer and a fault diagnosis device according to other embodiments of the invention.

PREFERRED EMBODIMENTS OF THE INVENTION

Figure 1:
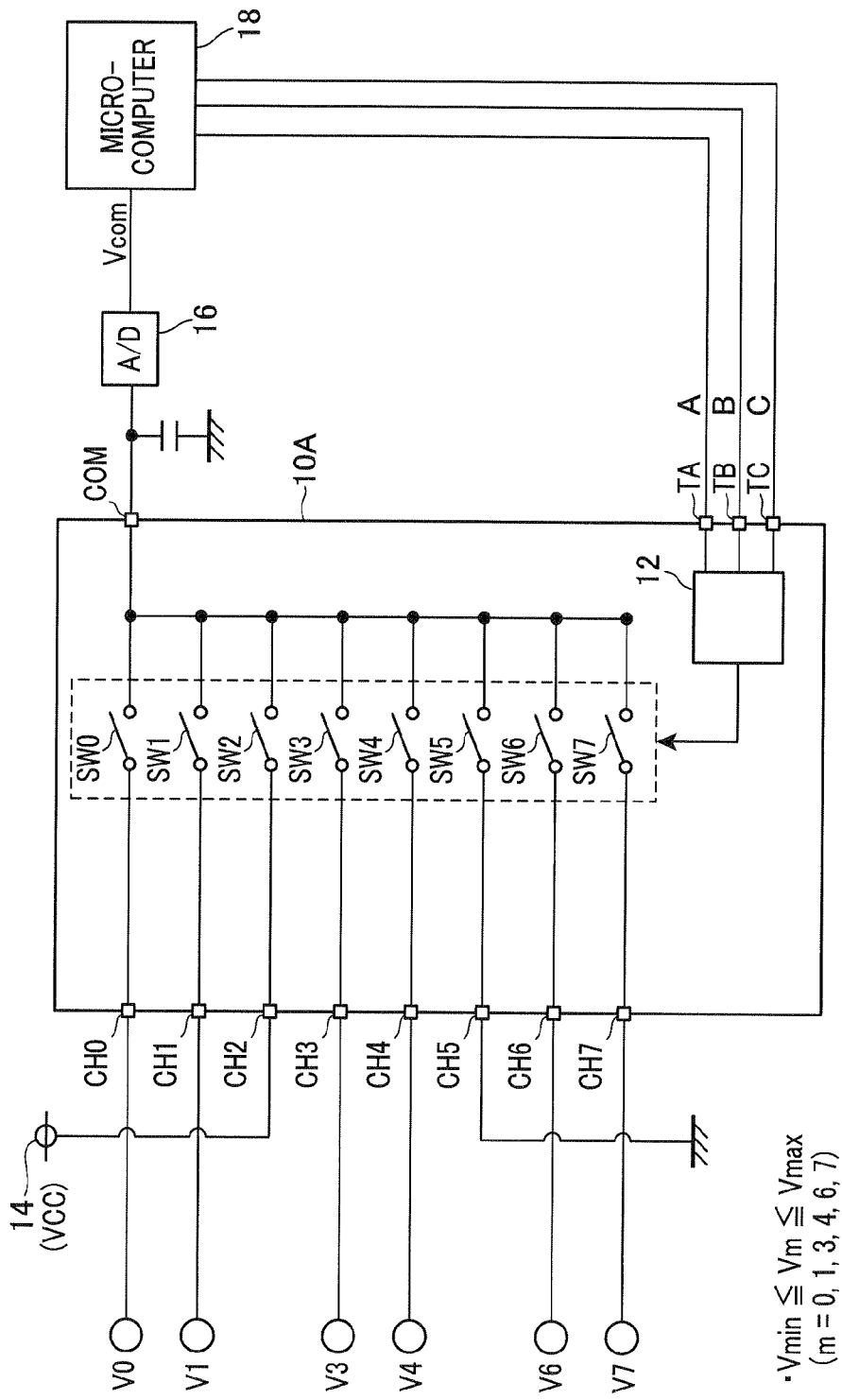
FIG. 1 is a diagram showing a structure of a multiplexer system including a multiplexer and a fault diagnosis device according to as a first embodiment of the invention.

In the below described embodiments, the same or equivalent components are indicated by the same reference numerals or letters.

First Embodiment

FIG. 1 shows an entire structure of a multiplexer system including a multiplexer 10A and a fault diagnosis device according to a first embodiment of the invention.

As shown in FIG. 1, the multiplexer 10A includes zeroth to seventh input channels (input terminals) CH0 to CH7, an output channel (output terminal) COM, zeroth to seventh switches SW0 to SW7, a selection circuit 12 which opens or closes the switches SW0 to SW7 in accordance with first to third manipulation signals A, B and C such that a selected one of the input channels CH0 to CH7 is connected to the output channel COM, and terminals TA, TB and TC for receiving the first to third manipulation signals A, B and C from a later-described microcomputer 18.

The nth (n being an integer from 0 to 7) input channel CHn is connectable to the output channel COM through the nth switch SWn.

The mth (m=0, 1, 3, 4, 6, 7) input channel CHm is connected to an external signal detection object (an object outputting a signal to be detected). In this embodiment, each of the signal detection objects outputs an analog voltage signal within a predetermined output voltage range from a minimum voltage Vmin (0.5 V, for example) to a maximum voltage Vmax (4.5 V, for example). Accordingly, a voltage inputted to the mth input channel CHm takes a value within the predetermined output voltage range.

The second input channel CH2 is connected to a power source 14 generating a terminal voltage VCC (5 V, for example). The fifth input channel CH5 is grounded. The power source 14 supplies electric power to the later explained microcomputer 18 in addition to the multiplexer 10A. In this embodiment, the potential of the ground is assumed to be zero.

The multiplexer 10A, a later described A/D converter 16 and the microcomputer 18 are mounted on a circuit board. The multiplexer 10A is formed as an integrated circuit. Accordingly, the nth input channel CHn, the output channel COM and the terminals TA to TC are pin terminals of the integrated circuit.

The selection circuit 12 includes a decoder. The selection circuit 12 is configured to close or open the nth input channel SWn based on the first to third manipulation signals A to C generated in accordance with a predetermined sequence.

The output channel COM of the multiplexer 10A is connected to the input terminal of the A/D converter 16. The A/D converter 16 converts the analog voltage signal outputted from the output channel COM into a digital signal.

The digital signal outputted from the A/D converter 16 (this digital signal being referred to as the "detection voltage Vcom" hereinafter).

The microcomputer 18 includes a CPU, a ROM and a RA which are not shown in the drawings. The microcomputer 18 monitors the detection voltage Vcom to perform various processes, and outputs the first to third manipulation signals A to C for closing or closing the nth switch SWn through the selection circuit 12.

The zeroth to seventh input channels CH0 to CH7 are assigned to eight inner channels of the multiplexer 10A selectable by the three-bit signal as a selection signal represented by the first to third manipulation signals A to C. The selection circuit 12 selects one of the input channels CH0 to CH7 to be connected to the output channel COM in accordance with the three-bit signal, closes the switch corresponding to the selected input channel, and opens the switches corresponding to the other input channels.

There may occur a fault in the multiplexer 10A such as a stick fault or a pin short-circuit fault. Here, a stick fault is a fault in which the logic state of one of the first to third manipulation signals A to C is fixed and cannot be inverted. A stick fault may be caused by an open fault in the terminals TA to TC or in electrical paths between the terminals TA to TC and the microcomputer 18, or by a fault occurred in the selection circuit 12 or microcomputer 18, for example. A pin-short circuit fault is a fault in which either two of the terminals TA to TC are short-circuited.

If such a fault occurs, the detection voltage Vcom may deviate from its normal value supposed to appear in the normal state (when the multiplexer 10A operates normally) as shown in the table of FIG. 2. In the table of FIG. 2, there are shown values of the detection voltage Vcom in the normal state and in fault states (when the multiplexer 10A has a stick fault or a pin short-circuit fault) for the respective input channels CH0 to CH7 selectable by the three-bit signal represented by the manipulation signals A, B and C. The shading in the table of FIG. 2 indicates that the detection voltage Vcom deviates from its normal value. If there occurs such a fault in the multiplexer 10A, it is not possible for the microcomputer 18 to perform various processes correctly.

To cope with this potential problem, the microcomputer 18 performs a fault diagnosis process to determine whether the multiplexer 10A is operating normally or not based on the values of the detection voltage Vcom. Next, the fault diagnosis process is explained.

Prior to explaining the fault diagnosis process, a method of assignment of diagnostic channels is explained with reference to FIG. 3. FIG. 3 shows how each of the eight input channels C0 to C7 is assigned to the three-bit signal.

Of the eight input channels CH0 to CH7, the second and fifth input channels CH2 and CH5 are used also as diagnostic channels. The reason why the second and fifth input channels CH2 and CH5 are used also as the diagnostic channels is that they are in a mutually exclusive relationship in logic state, that is, the logic states of the three bits of the three-bit signal assigned to the second input channel CH2 and those of the fifth input channel CH5 are in an inverted relationship. In this embodiment, the second input channel CH2 is connected to the power source 14 and the fifth input channel CH5 is grounded as shown in FIG. 1. This is because the second and fifth input channels CH2 and CH5 are used as the diagnostic channels.

Next, the fault diagnosis process performed in this embodiment is explained with reference to FIG. 4. This process is performed by the microcomputer 18 after each N (N being a positive integer) cycles of the opening/closing sequence of the first to seventh switches SW0 to SW7.

This process begins in step S10 where the first and third manipulation signals A and C are set to the logic low level ("L-level" hereinafter) and the second manipulation signal B is set to the logic high level ("H-level" hereinafter) in order to select the second input channel CH2 used as the diagnostic channel to be connected the diagnostic channel. As a result, of the zeroth to seventh switches SW0 to SW7, only the second switch SW2 is closed.

In subsequent step S12, it is detected whether or not the detection voltage Vcom is higher than a first threshold voltage Vα (4.5 V, for example). Here, the first threshold voltage Vα is set higher than or equal to the maximum voltage Vmax and lower than the terminal voltage VCC of the power source 14. In this embodiment, the terminal voltage VCC is used as a diagnostic voltage.

If the detection result in step S12 is negative, the process determines that the detection voltage Vcom is different from the diagnostic voltage, and proceeds to step S14. In step S14, a diagnosis that there is a fault in the multiplexer 10A is made. It is preferable that the result of this diagnosis is informed to the user.

On the other hand, if the detection result in step S12 is affirmative, the process proceeds to step S16 where the first and third manipulation signals A and C are changed to the H-level and the second manipulation signal B is changed to L-level in order to select the fifth input channel CH5 used as the diagnostic channel to be connected to the output channel. That is, the logic states of these manipulation signals are inverted. As a result, of the zeroth to seventh switches SW0 to SW7, only the fifth switch SW5 is closed.

In subsequent step S18, it is detected whether or not the detection voltage Vcom is lower than a second threshold voltage Vβ (0.5 V, for example). Here, the second threshold voltage Vβ is set higher than the ground voltage of zero and lower than the minimum voltage Vmin. In this embodiment, the ground voltage of zero is used as a diagnostic voltage.

If the detection result in step S18 is negative, the process determines that the detection voltage Vcom is different from the diagnostic voltage. That is, the process determines that the logic states of all of the three bits of the three-bit signal have not been inverted by the operation of step S16. In this case, the process proceeds to step S14 where a diagnosis that there is a fault in the multiplexer 10A is made.

On the other hand, if the determination result in step S18 is affirmative, the process proceeds to step S20 to make a diagnosis that there is no fault in the multiplexer 10A, that is, the multiplexer 10A is operating normally.

After completion of step S14 or S20, the process is terminated temporarily.

The first embodiment described above provides the following advantages.

(1) The input voltages of the second and fifth input channels CH2 and CH5 used also as the diagnostic channels are set to the terminal voltage VCC and the ground voltage of zero, respectively, which are out of the predetermined output voltage range. If the detection voltage Vcom which appears when the second input channel CH2 is selected to be connected to the output channel COM is detected to be lower than the first threshold voltage Vα, or if the detection voltage Vcom which appears when the fifth input channel CH5 is selected to be connected to the output channel COM is detected to be higher than the second threshold voltage Vβ, a diagnosis that there is a fault in the multiplexer 10A is made. Accordingly, it is possible to reliably determine, for each of all the input channels CH0 to CH7, whether a fault is present. Hence, according to the first embodiment, it is possible to reliably diagnose whether the multiplexer 10A is normal or faulty.

Only two of the eight input channels CH0 to CH7 are used also as the diagnostic channels for diagnosing the multiplexer 10A. Accordingly, the circuit scale and the manufacturing cost of the fault diagnosis device for the multiplexer 10A can be prevented from increasing.

(2) The second input channel CH2 is connected to the power source 14 supplying power to the microcomputer 18, and the fifth input channel CH5 is grounded. Accordingly, it is not necessary to provide a power source dedicated to the fault diagnosis device.

Second Embodiment

Next, a second embodiment of the invention is described focusing on differences with the first embodiment.

Figure 5:
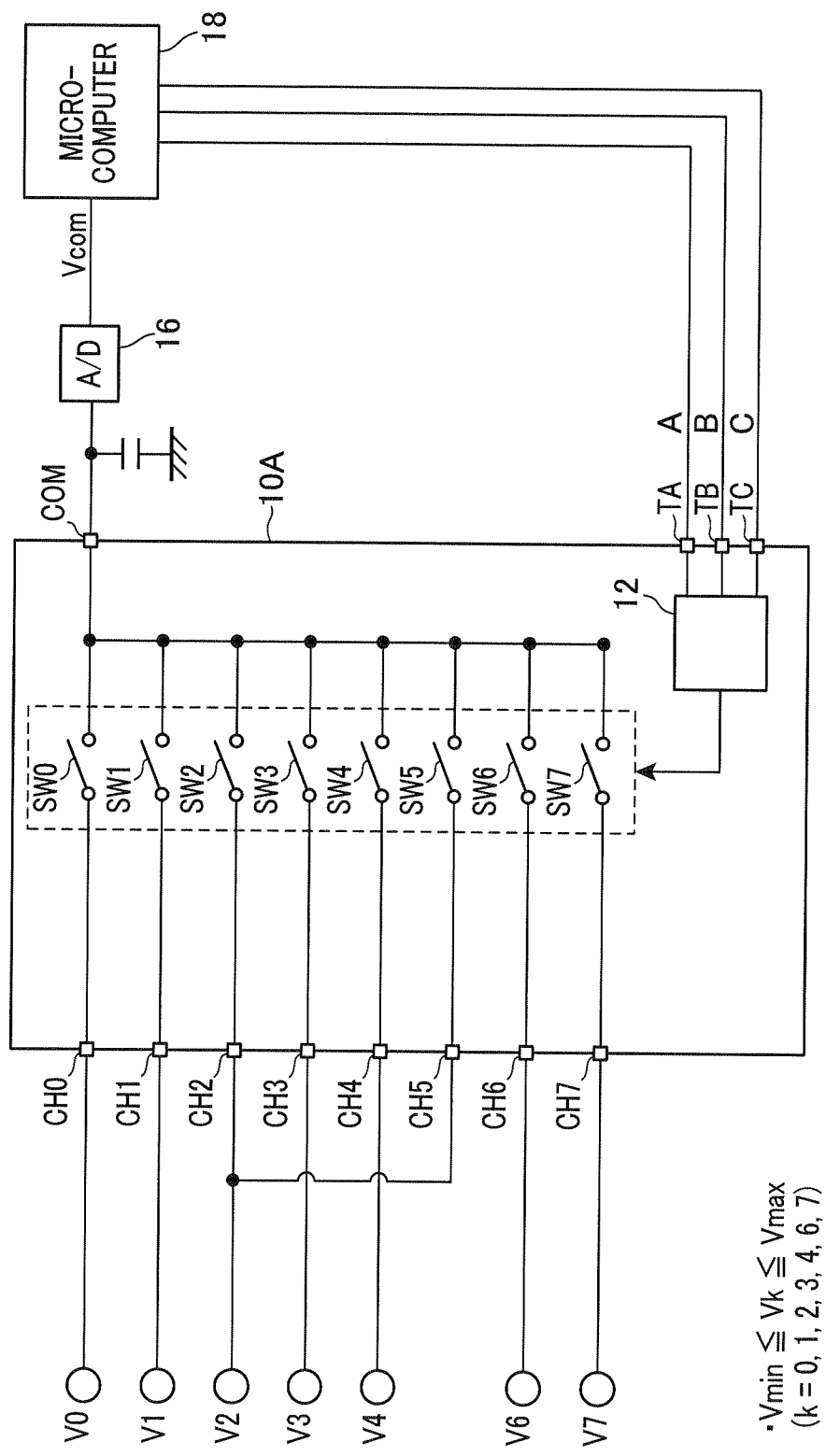
FIG. 5 is a diagram showing a structure of a multiplexer system including a multiplexer and a fault diagnosis device according to a second embodiment of the invention.

FIG. 5 shows an entire structure of a multiplexer system including the multiplexer 10A and a fault diagnosis device according to a second embodiment of the invention.

As shown in FIG. 5, in the second embodiment, the second and fifth input channels CH2 and CH5 are connected to the same external signal detection object. That is, the second and fifth input channels CH2 and CH5 are short-circuited to each other.

In this embodiment, the signal detection object connected to the second and fifth input channels CH2 and CH5 outputs an analog voltage signal within the predetermined output voltage range from the minimum voltage Vmin to the maximum voltage Vmax.

Figure 6:
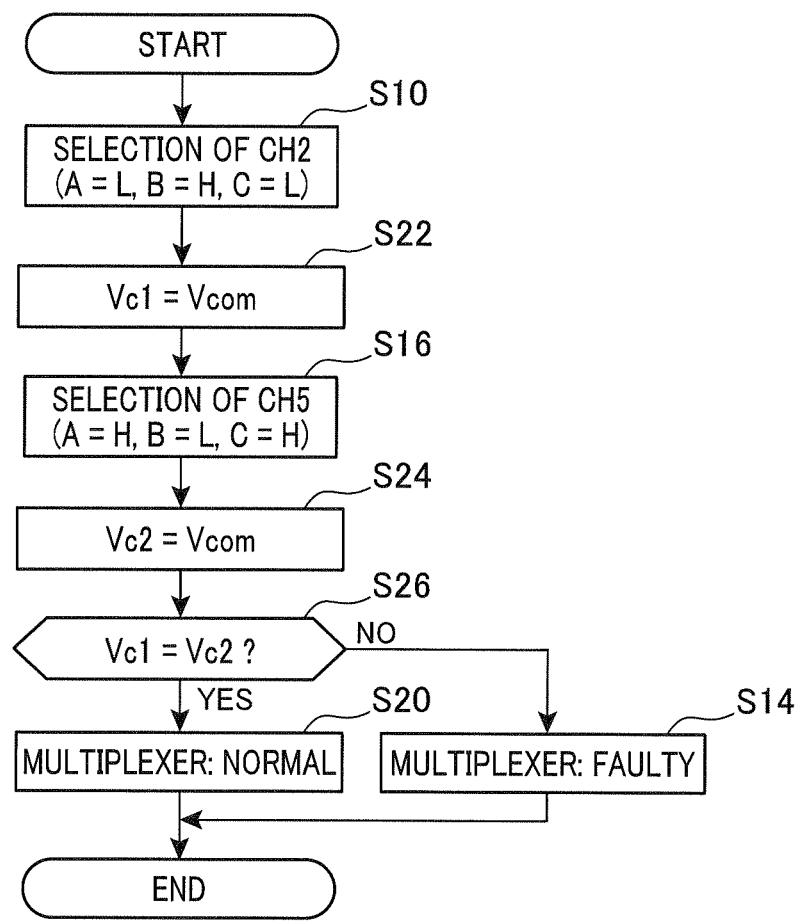
FIG. 6 is a flowchart showing steps of a fault diagnosis process performed in the second embodiment.

FIG. 6 is a flowchart showing steps of a fault diagnosis process performed in the second embodiment. This process is performed by the microcomputer 18 after each N (N being a positive integer) cycles of the opening/closing sequence of the zeroth to seventh switches SW0 to SW7. In FIG. 6, the same steps as those shown in FIG. 4 are indicated by the same step numbers.

In this embodiment, after completion of step S10, the process proceeds to step S22 where the detection voltage Vcom is stored in a first storage parameter Vc1.

Thereafter, the process proceeds to step S24 by way of step S16. In step S24, the detection voltage Vcom is stored in a second storage parameter Vc2.

In subsequent step S26, it is determined whether or not the value of the first storage parameter Vc1 is the same as the value of the second storage parameter Vc2. Step S26 is provided for diagnosing whether there is a fault in the multiplexer 10. In this embodiment, the input voltage V2 of the second input channel CH2 is used as the diagnostic voltage. Accordingly, if the determination result in step S26 is negative, it means that one of the detection voltage Vcom which appears while the second input channel CH2 is selected and the detection voltage Vcom which appears while the fifth input channel CH5 is selected differs from the diagnostic voltage.

If the determination result in step S26 is negative, the process proceeds to step S14. On the other hand, if the determination result in step S26 is affirmative, the process proceeds to step S20.

After completion of steps S14 or S20, the process is terminated temporarily.

In the second embodiment described above, the second and fifth input channels CH2 and CH5 are short-circuited with each other, and the fault diagnosis process as shown in FIG. 6 is performed. According to the second embodiment, in addition to the same advantages as those provided by the first embodiment, there is provided an advantage that, since the fault diagnosis process can be performed by using only one diagnostic channel, reduction of the number of the input channels connected to the external signal detection objects can be reduced.

Third Embodiment

Next, a third embodiment of the invention is described focusing on differences with the first embodiment.

FIG. 7 shows an entire structure of a multiplexer system including a multiplexer 10B and a fault diagnosis device according to a third embodiment of the invention.

As shown in FIG. 7, the multiplexer 10B operates in accordance with a four-bit signal as a selection signal constituted of the first to fourth manipulation signals A to D. In this embodiment, the multiplexer 10B includes the zeroth to ninth input channels CH0 to CH9, the zeroth to eleventh switches SW0 to SW11, the selection circuit 12 for opening and closing the switches SW0 to SW11 in accordance with the four-bit signal and the first to fourth terminals TA to TD for receiving the first to fourth manipulation signals A to D outputted as the four-bit signal from the microcomputer 18.

The pth input channel CHp (p=0 to 9) is connectable to the output channel COM through the pth switch SWp. The pth input channel CHp is connected to the external signal detection object. In this embodiment, like in the first embodiment, each of the signal detection objects outputs an analog voltage signal within the predetermined output voltage range from the minimum voltage Vmin to the maximum voltage Vmax.

The output channel COM is connected through a parallel connection of the tenth and eleventh switches SW10 and SW11 to a power source 20 which generates the terminal voltage VCC.

The microcomputer 18 outputs the first to fourth manipulation signals A to D to the selection circuit 12 in order to open or close the pth switch.

Next, a method of assignment of diagnostic channels is explained prior to explaining a fault diagnosis process performed in this embodiment.

As shown in FIG. 8, two diagnostic channels are assigned to two of the sixteen inner channels C0 to C15 selectable by the four-bit signal, which are in a mutually exclusive relationship in logic state. In this embodiment, the two diagnostic channels are assigned to the inner channels C5 and C10. FIG. 8 shows channel selection patterns indicating logic states (bit states) of the four-bit signal in the normal state and in fault states for the respective inner channels C0 to C15. The shaded channel numbers in the table of FIG. 8 show channel numbers of the mis-selected inner channels. In this embodiment, the diagnostic channel assigned to the inner channel C5 is indicated by "CH10", and the diagnostic channel assigned to the inner channel C10 is indicated by "CH11".

Next, assignment of the input channels is performed.

In this embodiment, none of the input channels doubles as the diagnostic channel, and not all the inner channels other than the two inner channels C5 and C10 assigned to the diagnostic channels CH10 and CH11 are assigned to the input channels. That is, the number of the input channels is smaller than the maximum number of the inner channels selectable by the four-bit signal. In this embodiment, since the number of the input channels is ten, four of the sixteen inner channels C0 to C15 are not assigned to either the input channels or the diagnostic channels. These four inner channels are called "non-use channels" hereinafter. Next, a method of assignment of the input channels and the diagnostic channels is explained with reference to FIGS. 9 and 10.

Figure 9:
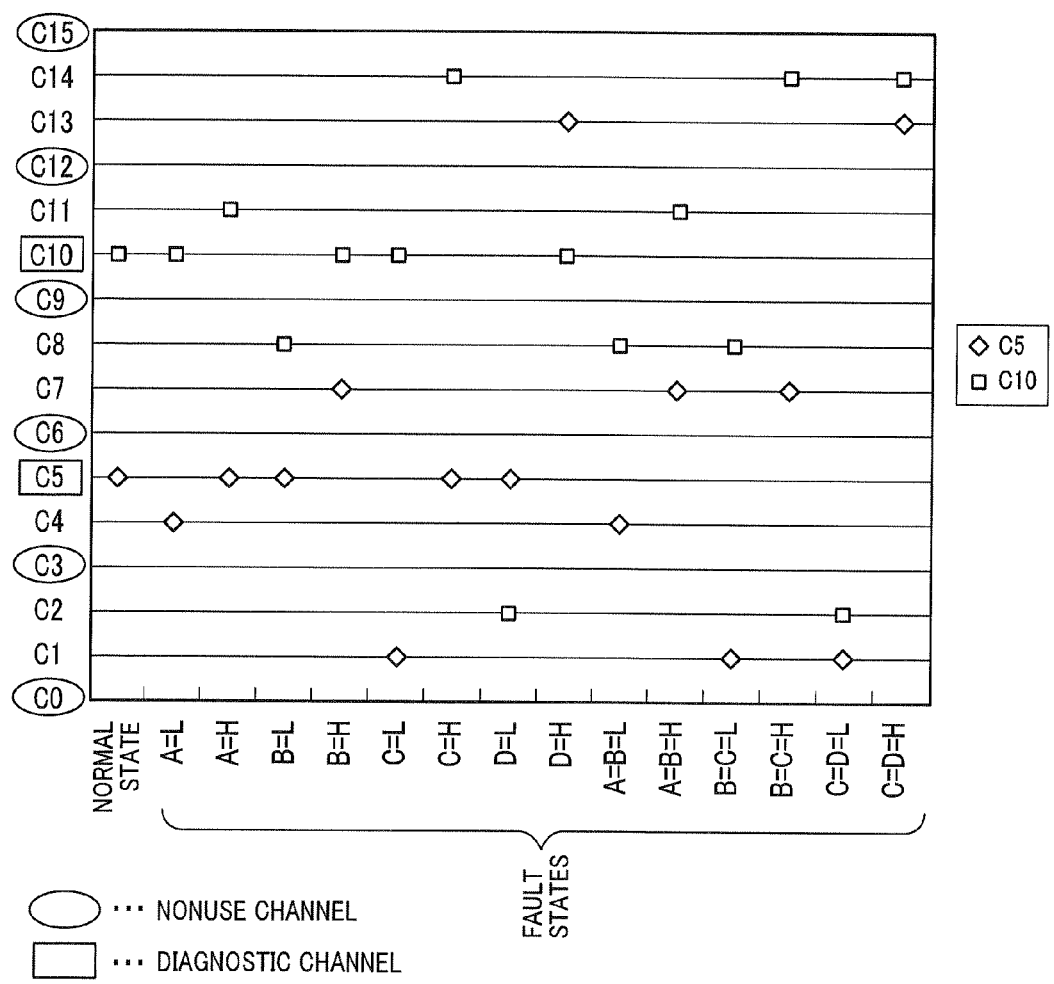
FIG. 9 is a diagram showing a method of assignment of non-use channels performed in the third embodiment.

FIG. 9 shows channel numbers of the inner channels that can be wrongly selected when the diagnostic channel has been selected to be connected to the output channel COM in a case where there is a fault in the multiplexer 10. In FIG. 9, "NON-USE CHANNEL CANDIDATES" means the six inner channels that cannot be wrongly selected when the diagnostic channel has been selected to be connected to the output channel COM in a case where there is a fault in the multiplexer 10.

As shown in FIG. 9, this embodiment satisfies a condition that the non-use channels are assigned with four of the six non-use channel candidates (this condition being referred to as the "wrong selection avoidance condition" hereinafter). This condition is for increasing the reliability of the fault diagnosis on the multiplexer 10.

This is because, when the non-use channel is selected, since the detection voltage Vcom detected by the microcomputer 18 is relatively unstable, it may become equal to the terminal voltage VCC of the power source 20. Accordingly, if the non-use channel is assigned to the inner channel that can be wrongly selected when the diagnostic channel has been selected to the output channel COM in a case where the multiplexer 10 has a fault, it may occur that a fault diagnosis process, which is described later with reference to FIG. 11, determines that there is no fault although actually the multiplexer 10 has a fault. To avoid such a situation, this embodiment is configured to satisfy the wrong selection avoidance condition.

FIG. 10A shows assignment of the diagnostic channels CH10 and CH 11 and the non-use channel candidates shown in FIG. 9. In order to assigning the input channels and the non-use channels to the inner channels while satisfying the wrong selection avoidance condition, the following equation e1 has to be satisfied.

$$\text{(the number of the non-use channel candidates)} \geq \text{(the number of the non-use channels)} \quad \text{(eq1)}$$

where (the number of the non-use channels)=2^(the number of the bits of the selection signal)−(the number of the input channels)−(the number of the diagnostic channels)

In this embodiment, since the four-bit signal is used as the selection signal, the number of the input channels is 10, and the number of the diagnostic channels is 2, the number of the non-use channels is 4. Since the number of the non-use channel candidates is 6 as shown in FIG. 10A, the equation (eq1) is satisfied. Accordingly, it is possible to make the assignment of the input channels and the non-use channels so as to satisfy the wrong selection avoidance condition. As shown in FIG. 10B, in this embodiment, of the six non-use channel candidates C0, C3, C6, C9, C12 and C15, the inner channels C6, C9, C12 and C15 are assigned with the non-use channels. Further, the zeroth to ninth input channels CH0 to CH9 are assigned to the ten inner channels C0 to C4, C7, C8, C11, C13 and C14 which are not assigned with the diagnostic channels CH10 and CH 11 or the non-use channels.

Figure 11:
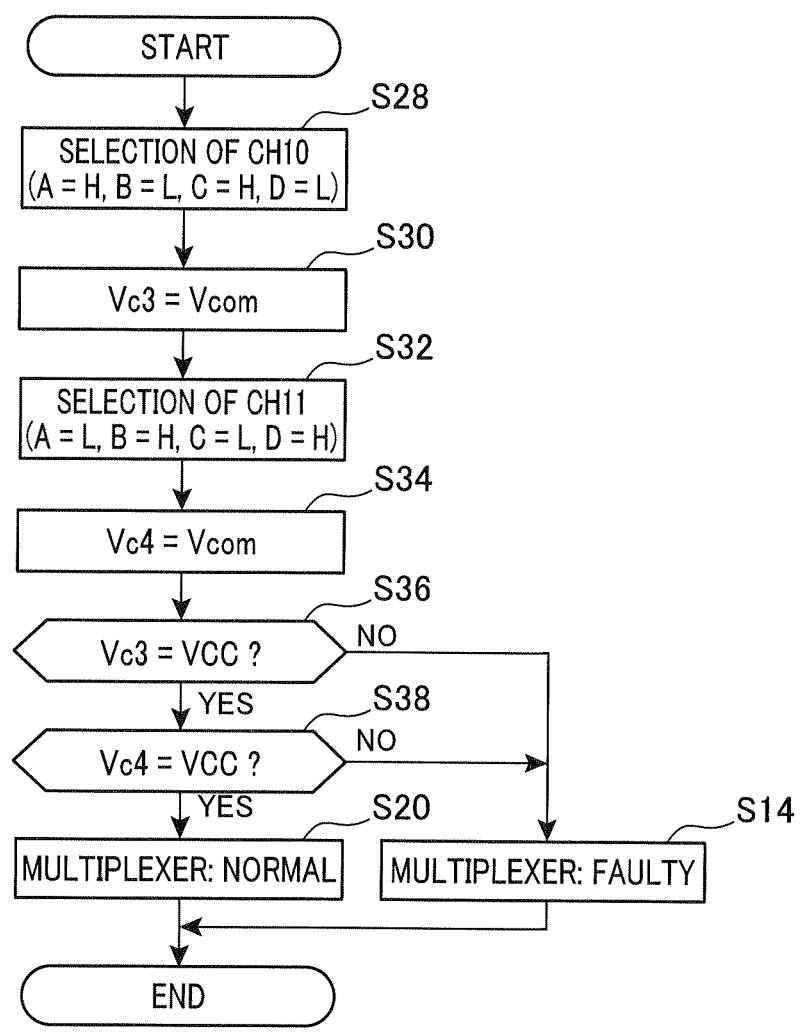
FIG. 11 is a flowchart showing steps of a fault diagnosis process performed in the third embodiment.

FIG. 11 shows steps of the fault diagnosis process performed in this embodiment. This process is performed by the microcomputer 18 after each N (N being a positive integer) cycles of the opening/closing sequence of the zeroth to ninth switches SW0 to SW9. In FIG. 11, the same steps as those shown in FIG. 4 are indicated by the same step numbers.

This process begins in step S28 where the first and third manipulation signals A and C are set to the H-level, and the second and fourth manipulation signals C and D are set to the L-level in order to select the diagnostic channel CH10 to be connected to the output channel COM. As a result, of the zeroth to eleventh switches SW0 to SW11, only the tenth switch SW10 is closed.

In subsequent step S30, the detection voltage Vcom is stored in the third storage parameter Vc3.

In subsequent step S32, the first and third manipulation signals A and C are changed to the L-level, and the second and fourth manipulation signals C and D are changed to the H-level in order to select the diagnostic channel CH11 to be connected to the output channel COM. As a result, of the zeroth to eleventh switches SW0 to SW11, only the eleventh switch SW11 is closed.

In subsequent step S34, the common voltage Vcom is stored in the fourth storage parameter Vc4.

In subsequent step S36, it is determined whether or not the value of the third parameter Vc3 is equal to the terminal voltage VCC of the power source 20. Step S36 is for detecting whether or not there is a fault in the multiplexer 10. In this embodiment, the terminal voltage VCC of the power source 20 is used as the diagnostic voltage. Accordingly, if the determination result in step S36 is negative, it means that the detection voltage Vcom which appears while the diagnostic channel CH10 is selected differs from the diagnostic voltage.

If the determination result in step S36 is negative, the process proceeds to step S14.

On the other hand, if the determination result in step S36 is affirmative, the process proceeds to step S38 to determine whether or not the value of the fourth storage parameter Vc4 is equal to the terminal voltage VCC of the power source 20. Step S38 is provided for the same reason as step S36.

If the determination result in step S38 is negative, the process proceeds to step S14. On the other hand, if the determination result in step S38 is affirmative, the process proceeds to step S20.

After completion of steps S14 or S20, the process is terminated temporarily.

According to the third embodiment, in addition to the same advantages as those provided by the first embodiment, the following advantages are provided.

(3) The number of the input channels is smaller than the maximum number of the channels (C0 to C15) selectable by the four-bit signal. Further, the diagnostic channels CH10 and CH11 are provided within the multiplexer 10. Such a structure makes it possible to provide the diagnostic channels easily in a case where the number of the pin terminals of the IC constituting the multiplexer 10 is limited. In addition, it is possible to avoid the number of the input channels from being reduced for providing the diagnostic channels.

(4) The assignment of the input channels and the non-use channels is made so as to satisfy the wrong selection avoidance condition. This makes it possible to increase the reliability of the fault diagnosis on the multiplexer 10.

Other Embodiments

It is a matter of course that various modifications can be made to the above described embodiments as described below.

The method of assigning the diagnostic channels is not limited to the one described in the first embodiment. Any method can be used for assigning the diagnostic channels, if, of the eight inner channels C0 to C8 selectable by the three-bit signal, two channels which are in a mutually exclusive relationship in logic state are assigned with the diagnostic channels. For example, as seen from FIG. 3, the zeroth and seventh input channels CH0 and CH7 may be used as the diagnostic channels, or the first and sixth input channels CH1 and CH6 may be used as the diagnostic channels, or the second and fifth input channels CH2 and CH5 may be used as the diagnostic channels.

The number of the bits of the selection signal constituted of the manipulation signals may be any number equal to or larger than 2. In a case where a two-bit signal is used as the selection signal, the maximum number of the inner channels selectable by the selection signal is 4. Accordingly, in this case, it is possible that the four inner channels are assigned with the four input channels, and two of these four input channels are used also as the diagnostic channels.

The process shown in FIG. 4 may be modified such that step S12 is changed so as to make a determination whether or not the detection voltage Vcom is equal to the terminal voltage VCC of the power source 14, and step S18 is changed so as to make a determination whether or not the detection voltage Vcom is equal to the ground voltage of zero.

The method of setting the diagnostic voltages is not limited to the one described in the third embodiment.

For example, the diagnostic voltage inputted to the diagnostic channels CH10 and CH11 may be set to zero. This can be done by grounding one ends of the tenth and eleventh switches SW10 and SW11 on the side opposite the output channel COM.

For another example, two different voltages may be used as the two diagnostic voltages as long as they are set outside the predetermined output voltage range (between Vmin and Vmax).

The voltage range of each signal detection object does not necessarily have to be a single continuous range (0.5 to 4.5 V. for example) within the receivable range of the multiplexer 10 (0 to 5 V, for example). It may have split ranges. In the case of the first embodiment, if each of the signal detection objects has a split voltage range (0.5 to 2 V for V0, V1 and V3, and 3 to 4.5 V for V4, V6 and V7, for example), one of the terminal voltage VCC of the power source 14 and the ground voltage as the diagnostic voltage may be replaced by a voltage between the split voltage range. In this case, since the difference between the input voltages before and after change to the diagnostic channel can be reduced, fluctuation of the voltage of the output channel COM due to the channel change can be reduced.

In the second embodiment, three or more of the eight inner channels C0 to C7 selectable by the three-bit signal may be assigned with the input channels. In this case, the other inner channels not assigned with the input channels may be assigned with the non-use channels, for example.

The method of assigning the diagnostic channels is not limited to the one described in the third embodiment.

Figure 12:
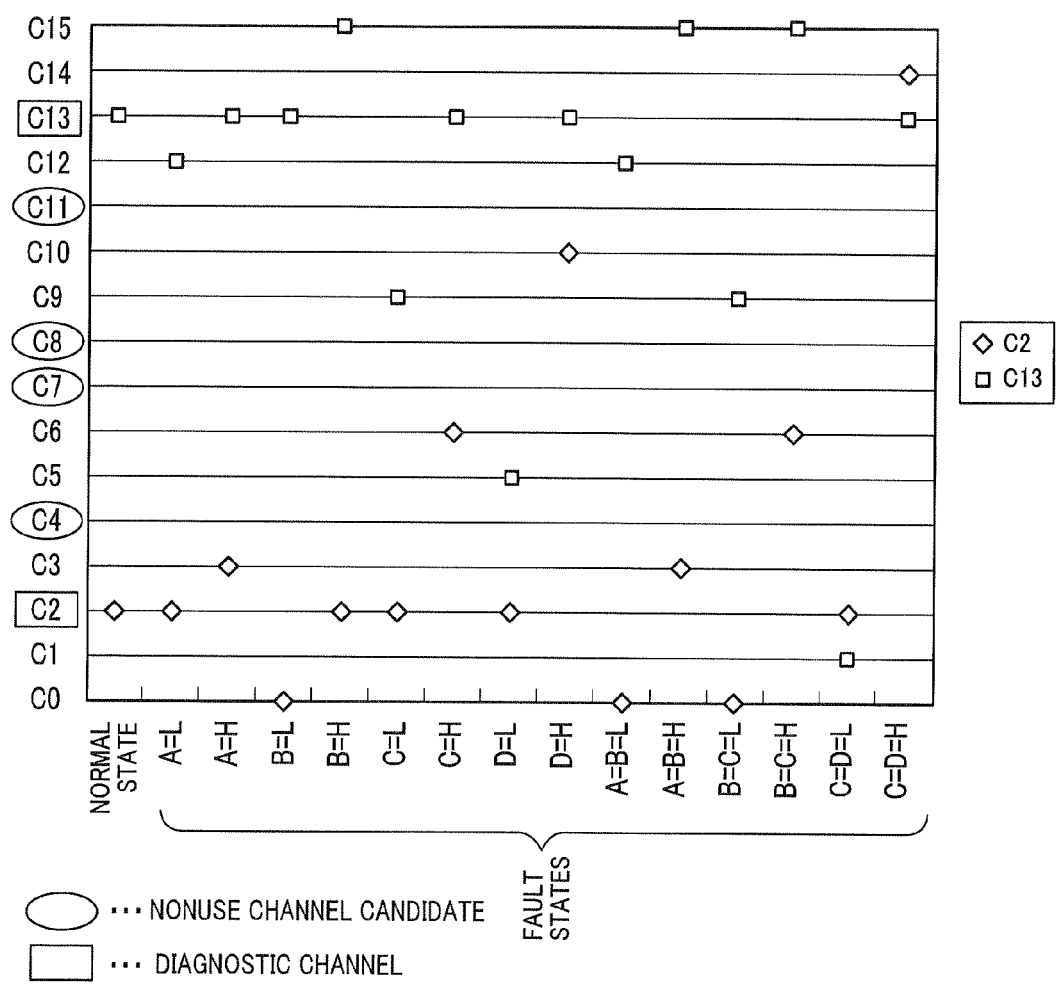

For example, as shown in FIG. 12, of the sixteen inner channels C0 to C15 selectable by the four-bit signal, the two channels C2 and C13 which are in a mutually exclusive relationship in logic state may be assigned to the diagnostic channels. In this case, since the number of the non-use channel candidates and the number of the non-use channels are both 4, the equation (eq1) is satisfied. Accordingly, as shown in FIG. 13, ten of the sixteen inner channels C0 to C15 and the two diagnostic channels can be assigned uniquely.

Further, of the sixteen inner channels C0 to C15, the channels C3 and C12 may be assigned with the diagnostic channels as shown in FIG. 14, or the channels C4 and C11 may be assigned with the diagnostic channels as shown in FIG. 15, or the channels C6 and C9 may be assigned with the diagnostic channels as shown in FIG. 16. Also in these cases, since the number of the non-use channel candidates and the number of the non-use channels are both 4, ten of the sixteen inner channels C0 to C15 and the two diagnostic channels can be assigned uniquely.

Figure 17:
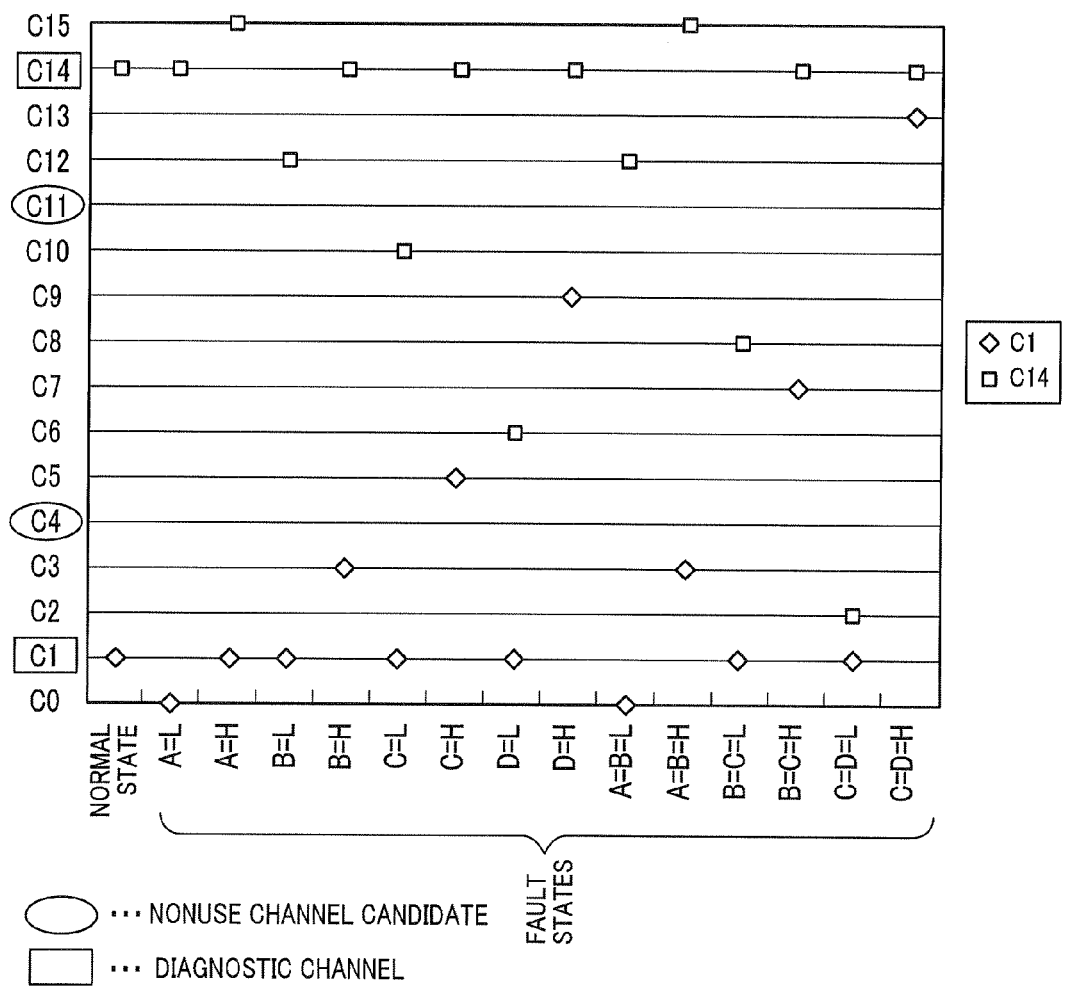

Incidentally, if the diagnostic channels are assigned to the inner channels C1 and C14, since the number of the non-use channel candidates is 2, the equation (eq1) is not satisfied as shown in FIG. 17. In this case, it is not possible to assign the input channels and the non-use channels satisfying the wrong selection avoidance condition.

In the third embodiment, one of the ten input channels of the multiplexer 10 may be grounded when the number of the signal detection objects to be connected to the input channels is 9. FIG. 18 shows a configuration in a case where the ninth input channel CH9 is grounded. Also in this case, since the voltages respectively inputted to the input channels are different from the diagnostic voltages, it is possible to diagnose whether the multiplexer 10 is faulty.

In the second embodiment, the range of the output voltage V2 of the signal detection object connected to the second and fifth input channels CH2 and CH5 may be outside the predetermined output voltage range from the minimum voltage Vmin to the maximum voltage Vmax. In the third embodiment, the terminal voltage VCC of the power source 20 may be within the predetermined output voltage range. In the above embodiments, the fault diagnosis process is performed by the microcomputer 18. However, the multiplexer 18 may be provided with an integrated circuit to perform the fault diagnosis process.

The above explained preferred embodiments are exemplary of the invention of the present application which is described solely by the claims appended below. It should be understood that modifications of the preferred embodiments may be made as would occur to one of skill in the art.

What is claimed is:

1. A fault diagnosis device for a multiplexer which includes at least two input channels, an output channel, and a selection circuit that connects a selected one of the input channels to the output channel in accordance with multi bit signals supplied from outside the multiplexer, two of the selectable input channels which are associated with two of the multi-bit signals that are in an inverted relationship in logic state being assigned with diagnostic channels, input voltages of the diagnostic channels being set to diagnostic voltages, the fault diagnosis device comprising a computer processor, the fault diagnosis device being configured at least to perform:

a voltage detection for detecting voltage appearing at the output level, and a diagnosis for performing, when the two diagnostic channels are selected in succession to be connected to the output channel, a process in which the multiplexer is determined to be faulty upon detecting that one of an output voltage of the output channel detected in the voltage detection when either one of the two diagnostic channels is selected and an output voltage of the output channel detected in the voltage detection when the other is selected differs from the diagnostic voltage.

2. The fault diagnosis device for a multiplexer according to claim 1, wherein the input channels are assigned to at least two of the selectable channels, the diagnostic channels being assigned to the channels of the selectable channels other than the channels assigned to the input channels.

3. The fault diagnosis device for a multiplexer according to claim 2, wherein the diagnostic voltages of the two diagnostic channels are set to the same voltage, and the fault diagnosis device being further configured to perform the process to determine that the multiplexer is faulty upon detecting that the output voltage of the output channel when one of the two diagnostic channels is selected and the output voltage of the output channel when the other is selected differ from each other.

4. The fault diagnosis device for a multiplexer according to claim 1, wherein the input channels are assigned to at least two of the selectable channels, and when the selectable channels other than the channels assigned to the input channels and the diagnostic channels are defined as non-use channels, the non-use channels are assigned to the channels of the selectable channels, which cannot be selected when the diagnostic channel is selected to be connected to the output channel if the multiplexer is faulty.

5. The fault diagnosis device for a multiplexer according to claim 1, wherein the input channels are assigned to at least three of the selectable channels, the two diagnostic channels are used also as two of the input channels and short-circuited to each other, and the fault diagnosis device is further configured to determine that the multiplexer is faulty upon detecting that the output voltage of the output channel when one of the two diagnostic channels is selected and the output voltage of the output channel when the other is selected differ from each other.

6. The fault diagnosis device for a multiplexer according to claim 1, wherein the diagnostic voltages are set to a voltage different from the input voltage of each of the input channels other than the diagnostic channels.

7. The fault diagnosis device for a multiplexer according to claim 6, wherein the input voltage of each of the input channels other than the diagnostic channels is set within a predetermined voltage range, and the diagnostic voltages are set outside the predetermined voltage range.

8. The fault diagnosis device for a multiplexer according to claim 1, wherein the process in which the multiplexer is determined to be faulty determines occurrence of a stick fault of the multiplexer.

9. The fault diagnosis device for a multiplexer according to claim 1, wherein the process in which the multiplexer is determined to be faulty determines occurrence of a pin short-circuit fault of the multiplexer.

* * * * *